(12) United States Patent
Bode et al.

(10) Patent No.: US 6,737,208 B1
(45) Date of Patent: May 18, 2004

(54) METHOD AND APPARATUS FOR CONTROLLING PHOTOLITHOGRAPHY OVERLAY REGISTRATION INCORPORATING FEEDFORWARD OVERLAY INFORMATION

(75) Inventors: Christopher A. Bode, Austin, TX (US); Alexander J. Pasadyn, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 33 days.

(21) Appl. No.: 10/022,488

(22) Filed: Dec. 17, 2001

(51) Int. Cl.$^7$ .................................................. G03F 9/00
(52) U.S. Cl. ........................................... 430/30; 430/22
(58) Field of Search ...................................... 430/22, 30

(56) References Cited

U.S. PATENT DOCUMENTS

| | | | |
|---|---|---|---|
| 6,304,999 B1 | 10/2001 | Toprac et al. ................... | 716/4 |
| 6,458,605 B1 * | 10/2002 | Stirton ........................... | 438/7 |
| 2003/0115556 A1 | 6/2003 | Conrad et al. ................. | 716/4 |

FOREIGN PATENT DOCUMENTS

| | | |
|---|---|---|
| WO | WO 01/84382 A1 | 11/2001 |

OTHER PUBLICATIONS

International Search Report dated Oct. 9, 2003 (PCT/US02/20762; TT4542–PCT).

* cited by examiner

*Primary Examiner*—Christopher G. Young
(74) *Attorney, Agent, or Firm*—Williams, Morgan & Amerson, P.C.

(57) ABSTRACT

A method for controlling a photolithography process includes forming a first layer on a selected wafer. A first overlay error associated with the first layer is measured. At least one parameter in an operating recipe for performing a photolithography process on a second layer formed on the first wafer is determined based on at least the first overlay error measurement. A processing line includes a photolithography stepper, and overlay metrology tool, and a controller. The photolithography stepper is configured to process wafers in accordance with an operating recipe. The overlay metrology tool is configured to measure overlay errors associated with the processing of the wafers in the photolithography stepper. The controller is configured to receive a first overlay error measurement associated with the formation of a first layer on a selected wafer and determine at least one parameter in the operating recipe for performing a photolithography process on a second layer formed on the selected wafer based on at least the first overlay error measurement

18 Claims, 3 Drawing Sheets

METHOD AND APPARATUS FOR CONTROLLING PHOTOLITHOGRAPHY OVERLAY REGISTRATION INCORPORATING FEEDFORWARD OVERLAY INFORMATION

BACKGROUND OF THE INVENTION

1. Field of the Invention

This invention relates generally to the field of semiconductor device manufacturing and, more particularly, to a method and apparatus for controlling photolithography overlay registration incorporating feedforward overlay information.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Semiconductor devices are manufactured from wafers of a semiconducting material. Layers of materials are added, removed, and/or treated during fabrication to create the electrical circuits that make up the device. The fabrication essentially comprises four basic operations. Although there are only four basic operations, they can be combined in hundreds of different ways, depending upon the particular fabrication process.

The four operations typically used in the manufacture of semiconductor devices are:

layering, or adding thin layers of various materials to a wafer from which a semiconductor device is produced;

patterning, or removing selected portions of added layers;

doping, or placing specific amounts of dopants in the wafer surface through openings in the added layers; and heat treatment, or heating and cooling the materials to produce desired effects in the processed wafer.

As technology advances facilitate smaller critical dimensions for semiconductor devices, the need for reduction of errors increases dramatically. Proper formation of subsections within a semiconductor device is an important factor in ensuring proper performance of the manufactured semiconductor device. Critical dimensions of the subsections generally have to be within a predetermined acceptable margin of error for semiconductor devices to be within acceptable manufacturing quality.

One important aspect of semiconductor manufacturing is overlay control. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for the reduction of misalignment errors increases dramatically.

Generally, a set of photolithography steps is performed on a lot of wafers using a semiconductor manufacturing tool commonly referred to as an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface may generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes are required, improved methods are needed to revise input parameters that control manufacturing processes in a more automated and timely manner.

Typical overlay control techniques employ a feedback control methodology, where after patterning a layer of photoresist material, metrology data is collected to measure misregistration, or overlay error, between the photoresist layer and underlying layer(s). The feedback generated from the overlay error measurement may be provided to a process controller for updating the control signals of the photolithography tools for subsequently processed wafers. The overlay error may also be used in a fault detection scheme, whereby wafers with overlay errors that exceed a predetermined threshold are reworked by removing the errant photoresist layer and patterning a new one.

Feedback overlay techniques assume homogeneity between the wafer on which the overlay error is measured and the subsequent wafers to be patterned by the photolithography tool. As wafer processing techniques change from lot-to-lot control to wafer-to-wafer control, this assumption becomes less valid. A particular wafer, lot, or subset of wafers in a lot may not have identical overlay characteristics with respect to the underlying layers. A control action may have been take during the processing of wafers in a lot to reduce overlay errors or to correct a fault condition (i.e., rework). Accordingly, controlling overlay parameters based solely on feedback metrology data may not result in an adequate reduction of overlay variations.

The present invention is directed to overcoming, or at least reducing the effects of, one or more of the problems set forth above.

SUMMARY OF THE INVENTION

One aspect of the present invention is seen in a method for controlling a photolithography process. The method includes forming a first layer on a selected wafer. A first overlay error associated with the first layer is measured. At least one parameter in an operating recipe for performing a photolithography process on a second layer formed on the first wafer is determined based on at least the first overlay error measurement Another aspect of the present invention is seen in a processing line including a photolithography stepper, and overlay metrology tool, and a controller. The photolithography stepper is configured to process wafers in accordance with an operating recipe. The overlay metrology tool is configured to measure overlay errors associated with the processing of the wafers in the photolithography stepper. The controller is configured to receive a first overlay error measurement associated with the formation of a first layer on a selected wafer and determine at least one parameter in the operating recipe for performing a photolithography process on a second layer formed on the selected wafer based on at least the first overlay error measurement.

BRIEF DESCRIPTION OF THE DRAWINGS

The invention may be understood by reference to the following description taken in conjunction with the accompanying drawings, in which like reference numerals identify like elements, and in which.

Figure 1:
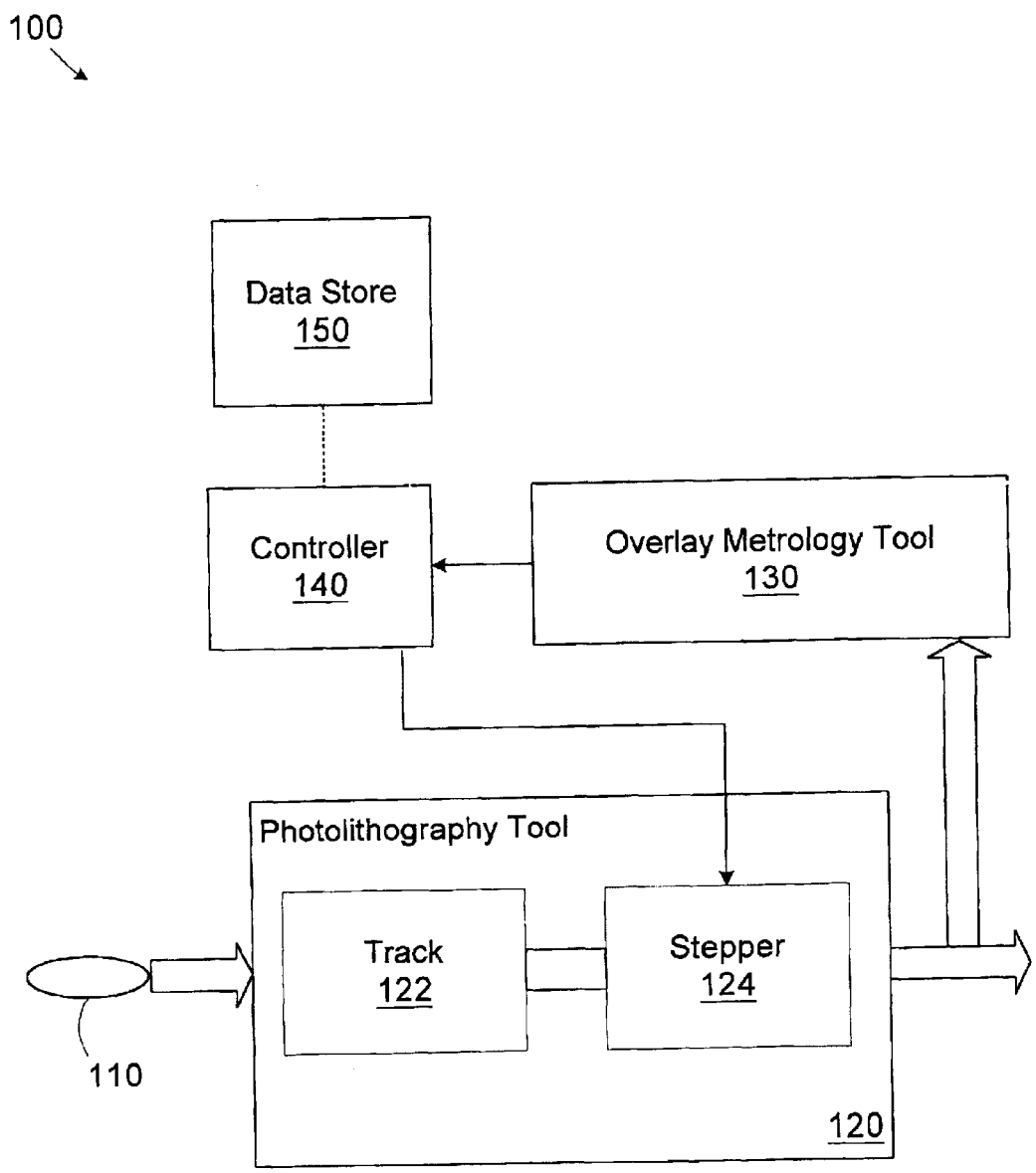
FIG. 1 is a simplified diagram of an illustrative processing line for processing wafers in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Overlay control is an important aspect of semiconductor manufacturing. In particular, overlay control involves measuring misalignment errors between semiconductor layers during manufacturing processes. Improvements in overlay control could result in substantial enhancements, in terms of quality and efficiency, in semiconductor manufacturing processes. The present invention provides a method of implementing automated error correction for control of overlay error.

Referring to FIG. 1, a simplified diagram of an illustrative processing line 100 for processing wafers 110 in accordance with one illustrative embodiment of the present invention is provided. The processing line 100 includes a photolithography tool 120 for forming a pattern in a photoresist layer formed on the wafer 110. The photolithography tool 120 includes a track 122 coupled to a stepper 124. The track 122 spins photoresist material onto the wafer 110 and pre-bakes the photoresist layer. The stepper 124 exposes the photoresist layer to form a pattern in the photoresist layer. The track 122 then performs a post-exposure bake (i.e., if necessary for the type of photoresist layer used) and applies a developer solution to remove the exposed portions of the photoresist layer (i.e., for a positive-type photoresist material) to generate a pattern in the photoresist layer. The photoresist layer is typically used as a mask for a subsequent etch process used to form features on the wafer 110 or as a mask for performing an implantation process (e.g., for doping a substrate to form active regions).

The processing line 100 also includes an overlay metrology tool 130 adapted to determine overlay errors in photoresist patterns formed by the photolithography tool 120. In general, the overlay metrology tool 130 may be any type of tool capable of measuring overlay error. For example, the overlay metrology tool 130 may include an optical review station, such as a 5200XP Overlay Metrology System offered by KLATencor Corporation of San Jose, Calif. The overlay metrology tool 130 may also measure overlay error using scatterometry, as described in U.S. patent application Ser. No. 09/894,546, entitled "METHOD AND APPARATUS FOR CONTROLLING PHOTOLITHOGRAPHY OVERLAY REGISTRATION," filed in the name of J. Broc Stirton, assigned to the assignee of the present patent application, and incorporated herein by reference in its entirety.

A controller 140 is provided for controlling the stepper 124 based on feedforward overlay metrology data collected by the overlay metrology tool 130. In some embodiment, the controller 140 may control the stepper 124 based on both feedforward and feedback overlay metrology data. A data store 150 is provided for storing overlay metrology data regarding the wafers 110 measured by the overlay metrology tool 130. For example, the overlay metrology data may be stored and indexed by wafer ID and/or lot ID, depending on the granularity available. Of course, the process line 100 may include multiple photolithography tools 120 collecting overlay data and multiple overlay metrology tools 130 with a shared or individual controllers 140.

The controller 140 adjusts the operating recipe of the stepper 124 to correct for overlay errors. In the illustrated embodiment, the controller 140 is a computer programmed with software to implement the functions described. However, as will be appreciated by those of ordinary skill in the art, a hardware controller designed to implement the particular functions may also be used. Additionally, the controller 140 may be a standalone controller, it may be integrated into a tool, such as the photolithography tool 120, or the overlay metrology tool 130, or it may be part of a system controlling operations in an integrated circuit manufacturing facility.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 140, as described, is the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Wafers 110 are processed in the stepper 124 using a plurality of control input signals. In the illustrated embodiment, the control inputs signals used to configure the stepper 124 include an x-translation signal, a y-translation signal, an x-expansion wafer scale signal, a y-expansion wafer scale signal, a reticle magnification signal, a reticle rotation signal, a wafer rotation signal, and a wafer non-orthogonality signal. Generally, errors associated with the reticle magnification signal and the reticle rotation signal relate to a particular exposure process on the surface of the wafer being processed in the exposure tool. The controller 140 is adapted to update the control input signals based on overlay error measurements performed by the overlay metrology tool 130 on a run-to-run basis.

When the stepper 124 completes processing of a wafer 110, the wafer 110 is examined by the overlay metrology tool 130. The wafer may be examined prior to developing of the photoresist layer (i.e., using the latent photoresist image) or after the developing process (i.e., using the photoresist pattern). The overlay metrology tool 130 provides a measurement of misregistration that was present in the previous exposure step. The amount of misregistration relates to the misalignment in the photolithography process that occurred between two layers formed on the wafer.

Figure 2:
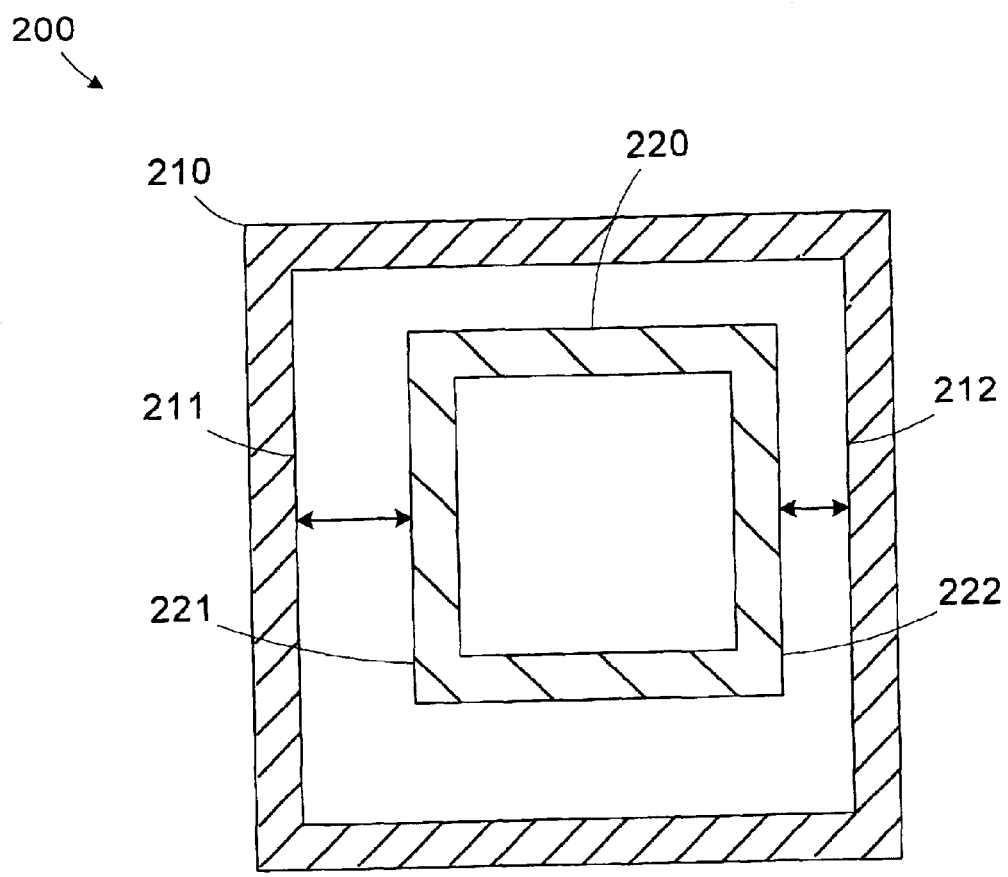
FIG. 2 is diagram of an exemplary test structure useful for measuring overlay errors in the processing line of FIG. 1.

Test structures for measuring overlay errors are well known to those of ordinary skill in the art. For example, FIG. 2 illustrates an exemplary test structure 200. The test structure 200 may be formed in a region of the wafer 110 not normally used for forming devices (e.g, in the periphery region where identification codes are typically scribed or in the scribe lines between production die). A first box 210 may be patterned in an underlying layer and a second box 220 may be patterned in the photoresist layer formed and patterned by the photolithography tool 120. Overlay error may be measured in X and Y directions by measuring the distances between the sides of the boxes 210, 220. For example, to measure overlay error in the X direction, the distance between sides 211, 221 may be compared to the distance been sides 212, 222. The overlay error is the half the difference between the measured distances. If the distance between the sides 211, 221 is 0.05 microns and the distance between the sides 212, 222 is 0.03 microns, the overlay error in the X direction is (0.050−0.03)/2=+0.01 micron. A distance of 0.04 microns for each group of sides would represent an overlay error of zero. A similar process may be used for determining overlay error in the Y direction.

The overlay metrology tool 130 stores the overlay error for the measured wafer 110 in the data store 150. Different overly error measurements may be generated for each layer formed on the wafer 110. The overlay error metrology data may be indexed by wafer/lot ID and layer.

Returning to FIG. 1, the process employed by the controller 140 for determining control actions for the photolithography tool 120 is described in more detail. In general, the controller 140 considers overlay error data from previous layers when determining the overlay settings for the stepper 124 for a current layer. This consideration of previous overlay error measurements is referred to herein as a feedforward control technique. Depending on the particular implementation, the controller 140 may determine control actions for individual wafers or for lots of wafers. If control is performed on a lot level, the feedforward overlay error data may be associated with one or more wafers in the lot that were measured. If control is performed on a wafer level, each wafer may have an associated feedforward overlay error measurement. Of course different degrees of granularity may be used. For example, an averaging or interpolation technique may be used for wafers without specific feedforward overlay error data available.

Prior to processing a selected wafer in the photolithography tool 120, the controller 140 accesses the data store 150 to determine the overlay error measured for the previous process layer. In some cases, all of the wafers in a lot may not have the same overlay error, because a feedback control action may have been taken during the processing of the lot to reduce the overlay error. Similarly, different lots processed on the same photolithography tool 120 may not have the same overlay error due to previous feedback control actions. The feedforward overlay error is considered when control actions are determined for the current photoresist layer being formed by the photolithography tool to account for these wafer-to-wafer or lot-to-lot overlay error variations.

In a simple control example, the feedforward overlay error is used as a direct offset to the feedback overlay determinations. For example, if post-processing feedback indicated a first wafer has an overlay error of +0.03 microns in one direction for the current layer, a typical feedback control action may try to adjust the stepper 124 settings to reduce this overlay error for a second wafer. Consider however, that the second wafer had an underlying layer that had an overlay error of +0.02 microns as compared to the underlying layer of the first wafer. If no control action were taken on the second wafer, the overlay error on the current layer would be +0.03−+0.02+0.01 microns due to the difference between the overlay errors in the underlying layer for the first and second wafers. If the control action were to adjust the stepper 124 based solely on the feedback overlay error measurement from the first wafer, the resulting overlay error (i.e., assuming perfect control) would be 0−+0.02=−0.02 microns. Thus, without incorporating the feedforward overlay error from the previous layer, the feedback error control technique may actually increase the overlay error.

The controller 140 may adjust the recipe of the stepper 124 for a current wafer as well as for subsequent wafers based on the feedforward overlay error data for the current wafer and the feedback overlay error data for the previous wafer. The controller 140 may be configured with a deadband range, in which no corrections are made. The feedforward and feedback overlay errors may be compared to a predetermined set of threshold parameters. In one embodiment, the deadband contains a range of error values associated with control input signals centered proximate a set of corresponding predetermined target values. If the feedforward and feedback overlay errors acquired from the overlay metrology tool 130 are smaller than their corresponding predetermined threshold values, that particular error is deemed to be in the deadband, and the controller 140 makes no changes to the overlay control inputs. A primary purposes of the deadband is to prevent excessive control actions from causing the semiconductor manufacturing process to be inordinately jittery.

When the controller 140 determines that an overlay error condition corresponding to an overlay control input signal is not inside the deadband, the feedforward and feedback overlay errors are used to update that overlay control input signal for a photolithography process performed on the current wafer, a subsequent wafer within the lot, or a subsequent lot of wafers. The controller 140 determines a step size for changing in the value of the overlay control input signal in accordance with a control model. Equation 1 below provides an exemplary control equation for determining a change to an overlay control input signal.

$$\text{New setting} = \text{Old setting} - [(\text{weight1})*(\text{feedback overlay error value})] - [(\text{weight2})*(\text{feedforward overlay error value})] \quad (1)$$

As illustrated in Equation 1, the controller 140 determines the new setting of the overlay control input signal by subtracting the magnitude of the old setting of the overlay control input signal from the products of the weights and the feedback and feedforward overlay error values. The weights are predetermined gain parameters that are assigned to the error value of a particular overlay control input signal. The particular values for the weights ay be determined by control simulation or experimentation.

Although the weight values can be used to partially control the step size of the change in the setting of the overlay control input signal, the values of the weights may still be insufficient to prevent an excessively large step size. In other words, even if optimum weights were to be assigned to a particular error signal, a calculated step size of a change in the setting of a control input signal may be too large, such that it could cause a controller of a semiconductor manufacturing tool to perform in an excessively jittery fashion. Accordingly, the controller 140 may compare the calculated step size to a predetermined maximum step size that is allowable for the change in setting of the overlay control input signal, and thus limit the step size.

One method for using the updated overlay control input signals is implemented using control threads. Control threads can be implemented by the controller 140. Control threads are a significant part of the control scheme of a semiconductor manufacturing tool, such as the stepper 124. Each control thread acts like a separate controller, and is differentiated by various process conditions. For overlay control, the control threads are separated by a combination of different conditions, including the semiconductor manufacturing tool (e.g., stepper 124) currently processing the wafer lot, the semiconductor product, the semiconductor manufacturing operation, and the semiconductor manufacturing tool that processed the semiconductor wafer or lot at a previous layer of the wafer.

Control threads account for different semiconductor manufacturing process conditions affect the overlay error in different fashions. By isolating each of the unique semiconductor manufacturing process conditions into its own corresponding control thread, the controller may more accurately evaluate the conditions in which a subsequent semiconductor wafer lot in the control thread will be processed. Since the error measurement is more relevant, changes to the overlay control input signals based upon the error will be more appropriate. The implementation of the control scheme described by the present invention can lead to a reduction in the overlay error.

After processing of a wafer, the overlay metrology tool 130 provides a feedback measure of the control error. Each of the error measurements corresponds to one of the overlay control input signals. The controller 140 determines a control action for a subsequent wafer based on this feedback measurement and feedforward overlay error data for the subsequent wafer. The controller 140 may perform various preprocessing or data manipulation activities when determining a control action. One such preprocessing activity is outlier rejection. Outlier rejection is a gross error check that is employed to ensure that the measured overlay errors are reasonable in light of the historical performance of the semiconductor manufacturing process. This procedure involves comparing each of the feedback and feedforward overlay errors to corresponding predetermined boundary parameters. In one embodiment, even if one of the predetermined boundaries is exceeded, the error data from the entire semiconductor wafer or lot may be rejected. To determine the limits of the outlier rejection boundary, thousands of actual semiconductor manufacturing fabrication data points are collected. The standard deviation for each error parameter in this collection of data is then calculated. The boundary threshold is selected as a multiple of the standard deviation (i.e., positive or negative). The selection of the outlier rejection boundary helps ensure that only the points that are significantly outside the normal operating conditions of the process are rejected.

A second preprocessing function the controller 140 may perform is to smooth out or filter the data. Overlay error measurements are subject to a certain amount of randomness. Filtering the feedback overlay error data results in a more accurate assessment of the error in the overlay control input signal settings. In one embodiment, the controller 140 uses an Exponentially—Weighted Moving Average (EWMA) filter to smooth the data, although other filtering procedures may be used. The equation for an EWMA filter is illustrated in Equation 2.

$$\text{New avg.} = (\text{weight})*(\text{current measurement}) + (1-\text{weight})*(\text{previous EWMA avg})]. \quad (2)$$

The weight is an adjustable parameter that can be used to control the amount of filtering and generally has a value between zero and one. The weight represents the confidence in the accuracy of the current data point. If the measurement is considered to be accurate, the weight should be close to one. If there were a significant amount of fluctuations in the process for previous processing runs, then a number closer to zero would be appropriate. The new average is calculated from the current measurement, the weight, and the last average calculated. The EWMA filtering process may use the previous average, the weight, and the current measurement as described above, or alternatively, only some of the data (i.e., the most recent) may be used to calculate the average.

The manufacturing environment in the semiconductor manufacturing facility presents some unique challenges. The order that the semiconductor wafer lots are processed through tools, such as the stepper 124, may not correspond to the order in which the overlay metrology tool 130 measures the overlay error. Such a situation could lead to data points being added to the EWMA average out of sequence. Also, wafers may be analyzed more than once to verify the error measurements. Without data retention, both readings would contribute to the EWMA average, which may be an undesirable characteristic. Furthermore, some of the control threads may have low volume, which may cause the previous average to be outdated such that it may not be able to accurately represent the error in the overlay control input signal settings. For these reasons, the controller 140 may access stored data to calculate the EWMA filtered error. Semiconductor wafer lot data, including the lot number, the time the lot was processed on the stepper 124, and the multiple error estimates, are stored in the data store 150 under the control thread name. When a new set of overlay error data is collected, the stack of data is retrieved from data store and analyzed. The lot number of the current semiconductor wafer lot being processed is compared to those in the stack. If the lot number matches any of the data present there, the error measurements are replaced. Otherwise, the data point is added to the current stack in chronological order, according to the time periods when the lots were processed through the stepper 124. In some embodiments, data points may expire after a predetermined time period (e.g., 48 hours).

As described above, the controller 140 may be implemented using an APC framework. Deployment of the control strategy taught by the present invention using the APC framework could require a number of software components. In addition to components within the APC framework, a computer script may be written for each of the semiconductor manufacturing tools involved in the control system, such as the stepper 124. When a semiconductor manufacturing tool in the control system is started, it generally initiates control script to complete the actions implemented by the controller 140. The control methods described above are generally defined and performed in these control scripts. The controller 140 may implement a control technique for a variety of control parameters for the stepper 124, including an x-translation parameter, a y-translation parameter, an x-expansion wafer scale parameter, a y-expansion wafer scale parameter, a reticle magnification parameter, a reticle rotation parameter, a wafer rotation parameter, and a wafer non-orthogonality parameter. The overlay control model may be developed empirically using commonly known linear or nonlinear techniques. The control model may be a relatively simple equation based model, as described above (e.g., linear, exponential, weighted average, etc.), or a more complex model, such as a neural network model, principal component analysis (PCA) model, or a projection to latent structures (PLS) model. The specific implementation of the model may vary depending on the modeling technique selected.

Overlay models may be generated by the controller 140, or alternatively, they may be generated by a different processing resource (not shown) and stored on the controller 140 after being developed. The overlay model may be developed using the stepper 124 or using a different tool (not shown) having similar operating characteristics. For purposes of illustration, it is assumed that the overlay model is generated and updated by the controller 140 or other processing resource based on the actual performance of the stepper 124 as measured by the overlay metrology tool 130. The overlay model may be trained based on historical data collected from numerous processing runs of the stepper 124.

Figure 3:
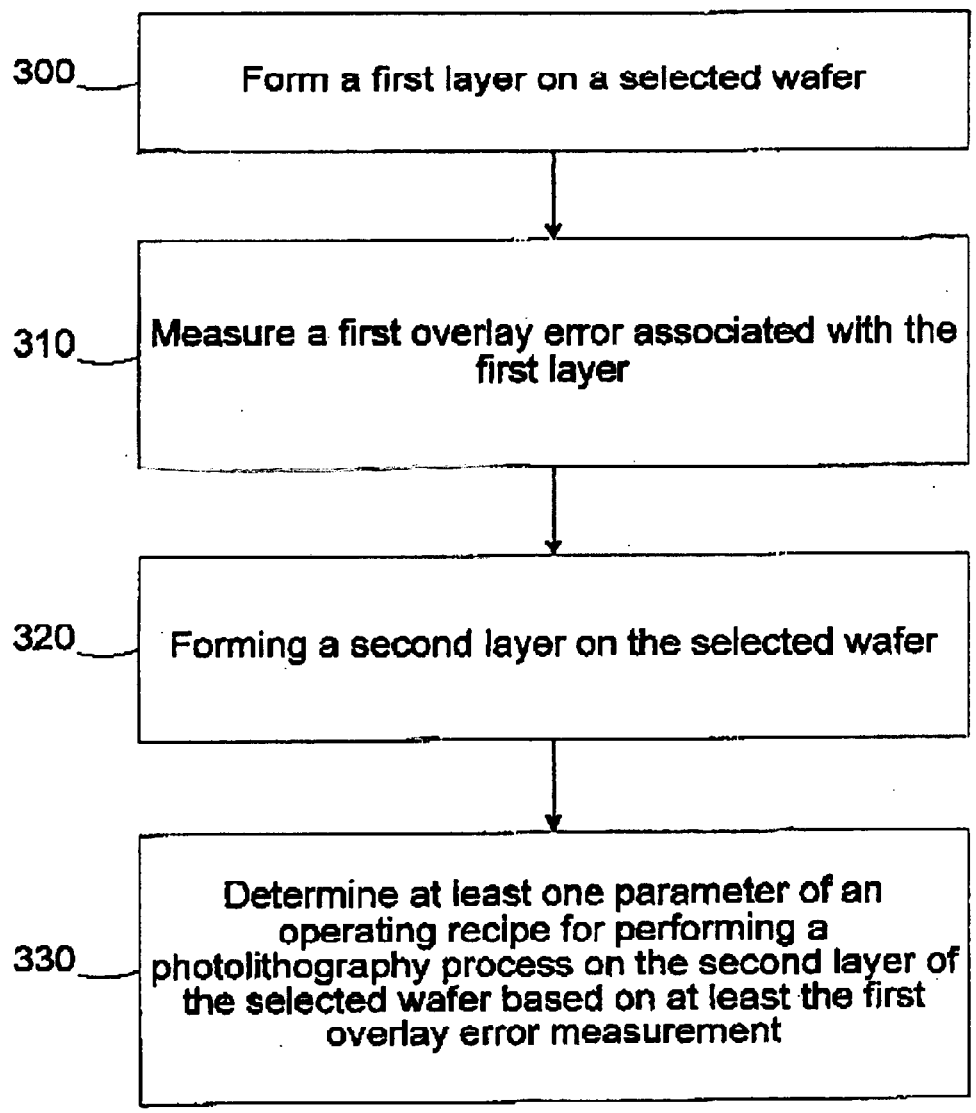
FIG. 3 is a simplified flow diagram of a method for controlling photolithography overlay registration incorporating feedforward overlay information in accordance with another illustrative embodiment of the present invention.

FIG. 3 is a simplified flow diagram of a method for controlling a photolithography process in accordance with another illustrative embodiment of the present invention. In block 300, a first layer is formed on a selected wafer. In block 310, a first overlay error associated with the first layer is measured. In block 320, a second layer is formed on the selected wafer. In block 330 at least one parameter of an operating recipe for performing a photolithography process on the second layer of the selected wafer is determined based on at least the first overlay error measurement.

Controlling overlay error based on feedback and feedforward measurements from the overlay metrology tool 130, as described above, has numerous advantages. The stepper 124 may be controlled to reduce the amount of variation encountered. Decreased variation reduces the likelihood that a device may be degraded or must be scrapped. Accordingly, the quality of the devices produced on the processing line 100 and the efficiency of the processing line 100 are both increased.

The particular embodiments disclosed above are illustrative only, as the invention may be modified and practiced in different but equivalent manners apparent to those skilled in the art of having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling a photolithography process, comprising:

forming a first patterned layer on a selected wafer;

measuring a first overlay error associated with the first layer;

forming a second layer on the selected wafer; and determining at least one parameter of an operating recipe for performing a photolithography process on the second layer of the selected wafer based on at least the first overlay error measurement.

2. The method of claim 1, further comprising performing the photolithography process on the second layer based on the operating recipe.

3. The method of 1, wherein determining the at least one parameter in the operating recipe further comprises determining the at least one parameter in the operating recipe of a photolithography tool.

4. The method of 1, wherein determining the at least one parameter in the operating recipe further comprises implementing a control thread associated with the performing of the photolithography process on the second layer.

5. The method of 1, wherein measuring the first overlay error further comprises measuring the first overlay error using a review station.

6. The method of 1, wherein measuring the first overlay error further comprises measuring the first overlay error using a scatterometry tool.

7. The method of claim 1, wherein determining the at least one parameter in the operating recipe further comprises determining at least one of an x-translation parameter, a y-translation parameter, an x-expansion wafer scale parameter, a y-expansion wafer scale parameter, a reticle magnification parameter, a reticle rotation parameter, a wafer rotation parameter, and a wafer non-orthogonality parameter.

8. The method of claim 1, further comprising performing the photolithography process on the second layer of the selected wafer based on the operating recipe.

9. The method of claim 1, wherein determining the at least one parameter in the operating recipe further comprises determining at least one of an x-translation parameter, a y-translation parameter, an x-expansion wafer scale parameter, a y-expansion wafer scale parameter, a reticle magnification parameter, and a reticle rotation parameter.

10. The method of claim 8, wherein the second layer comprises an exposes photoresist layer, and measuring the plurality of overlay errors associated with the process for forming the second layer further comprises measuring the overlay error in the exposed photoresist layer.

11. The method of claim 8, wherein the second layer comprises a developed photoresist layer, and measuring the plurality of overlay errors associated with the process for forming the second layer further comprises measuring the overlay error in the developed photoresist layer.

12. A method for controlling a photolithography process, comprising:

forming a first patterned layer on a selected wafer;

measuring a first overlay error associated with the first layer to generate a feedforward overlay error signal;

measuring a plurality of overlay errors associated with a process for performing a photolithography process on a second layer formed on a plurality of wafers to generate a feedback overlay error signal; and determining at least one parameter in an operating recipe for performing a photolithography process on the second layer formed on the selected wafer based on the feedforward overlay error signal and the feedback overlay error signal.

13. The method of 12, wherein determining the at least one parameter in the operating recipe further comprises determining the at least one parameter in the operating recipe of a photolithography tool.

14. The method of 12, wherein determining the at least one parameter in the operating recipe further comprises implementing a control thread associated with the performing the photolithography process on the second layer.

15. The method of 12, wherein measuring the first overlay error further comprises measuring the first overlay error using a review station.

16. The method of 12, wherein measuring the first overlay error further comprises measuring the first overlay error using a scatterometry tool.

17. The method of 12, wherein measuring the plurality of overlay errors associated with the process for forming the second layer further comprises measuring the plurality of overlay errors using a review station.

18. The method of 12, wherein measuring the plurality of overlay errors associated with the process for performing the photolithography process on the second layer further comprises measuring the plurality of overlay errors using a scatterometry tool.

* * * * *